(12) United States Patent
Sharma (10) Patent No.: US 12,170,524 B2
(45) Date of Patent: Dec. 17, 2024

(54) SAR ADC

(71) Applicant: Telefonaktiebolaget LM Ericsson (publ), Stockholm (SE)

(72) Inventor: Sunny Sharma, Limhamn (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 177 days.

(21) Appl. No.: 18/002,441

(22) PCT Filed: Jun. 25, 2020

(86) PCT No.: PCT/EP2020/067812
§ 371 (c)(1),
(2) Date: Dec. 19, 2022

(87) PCT Pub. No.: WO2021/259484
PCT Pub. Date: Dec. 30, 2021

(65) Prior Publication Data
US 2023/0231570 A1     Jul. 20, 2023

(51) Int. Cl.
H03M 1/12     (2006.01)
H03M 1/46     (2006.01)

(52) U.S. Cl.
CPC .................. H03M 1/468 (2013.01)

(58) Field of Classification Search
CPC ...... H03M 1/468; H03M 1/462; H03M 1/804; H03M 1/466; H03M 1/0682; H03M 1/68;
(Continued)

(56) References Cited

U.S. PATENT DOCUMENTS 6,667,707 B2 * 12/2003 Mueck .................. H03M 1/002
                                                              341/172
6,958,722 B1 10/2005 Janakiraman et al.
(Continued)

OTHER PUBLICATIONS

International Search Report and the Written Opinion of the International Searching Authority, issued in corresponding International Application No. PCT/EP2020/067543, dated Mar. 11, 2021, 11 pages.
(Continued)

*Primary Examiner* — Linh V Nguyen
(74) *Attorney, Agent, or Firm* — Rothwell, Figg, Ernst & Manbeck, P.C.

(57) ABSTRACT

A SAR ADC (50) is disclosed. It comprises a differential input port having a first input ($V_{inP}$) configured to receive a first input voltage and a second input ($V_{inN}$) configured to receive a second input voltage, of opposite polarity compared with first input voltage. Furthermore, it comprises a (300) having a first sub circuit (310P) comprising a first plurality of capacitors ($2C_u$, $C_u$), each connected to a common node (320P) of the first sub circuit (310P) with a first terminal, and a second sub circuit (310N) comprising a second plurality of capacitors ($2C_u$, $C_u$), each connected to a common node (320N) of the second sub circuit (310N) with a first terminal. For each capacitor ($2C_u$, $C_u$) of the first plurality of capacitors, the first sub circuit (310P) comprises a first switch (S4) connected between the first input ($V_{inP}$) of the SAR ADC and a second terminal of that capacitor, a second switch ($S_2$) connected between a first reference-voltage input ($V_{rP}$) and the second terminal of that capacitor, a third switch ($S_1$) connected between a second reference-voltage input ($V_{rN}$) and the second terminal of that capacitor, and a capacitive device ($X_P$) connected between the second input ($V_{inN}$) of the SAR ADC and the second terminal of that capacitor. The second sub circuit is arranged in a similar way.

17 Claims, 3 Drawing Sheets

(58) Field of Classification Search
CPC .... H03M 1/1033; H03M 1/0678; H03M 1/38;
H03M 1/00; H03M 1/002; H03M 1/1009;
H03M 1/1023; H03M 1/1061; H03M
1/12; H03M 1/1245; H03M 1/765; H03M
1/802; H03M 1/0604; H03M 1/069;
H03M 1/0692; H03M 1/0695; H03M
1/08; H03M 1/0863; H03M 1/1014;
H03M 1/1071; H03M 1/124; H03M
1/125; H03M 1/129; H03M 1/1295;
H03M 1/14; H03M 1/144; H03M 1/442;
H03M 1/72; H03M 1/76; H03M 3/426;
H03M 3/434; H03M 3/436; H03M 3/464;
H03M 3/498
USPC .......... 341/118–121, 150, 155, 172
See application file for complete search history.

(56) References Cited

U.S. PATENT DOCUMENTS

| | | | |
|---|---|---|---|
| 7,173,557 B2 | 2/2007 | Kuttner | |
| 8,040,271 B2 * | 10/2011 | Furuta | H03M 1/0682 341/172 |
| 8,860,600 B1 * | 10/2014 | Yang | H03M 1/466 341/172 |
| 8,933,930 B2 * | 1/2015 | Han | G06T 11/206 700/17 |
| 9,059,734 B1 | 6/2015 | Strode et al. | |
| 9,312,877 B2 | 4/2016 | Strode et al. | |
| 9,496,888 B1 | 11/2016 | Sharma et al. | |
| 9,553,599 B1 * | 1/2017 | Chen | H03M 1/1033 |
| 10,097,198 B1 * | 10/2018 | Lee | H03M 1/68 |
| 2011/0148675 A1 * | 6/2011 | Zhao | H03M 1/1033 341/118 |
| 2012/0280841 A1 * | 11/2012 | Wang | H03M 1/1295 341/172 |
| 2016/0373124 A1 * | 12/2016 | Kijima | H03M 1/002 |
| 2018/0269893 A1 * | 9/2018 | Chang | H03M 1/0682 |
| 2021/0058091 A1 * | 2/2021 | Fan | H03M 1/1033 |

OTHER PUBLICATIONS

Fan "A 12-bi 100 MS/s pipelined SAR ADC with addition-only digital error correction" Analog Integr Circ Sig Process (2014) 81:325-339, DOI 10.1007/s10470-014-0378-7.
Liu et al. "A 10-bit 50-MS/s SAR ADC With a Monotonic Capacitor Switching Procedure" IEEE Journal of Solid-State Circuits, vol. 45, No. 4, Apr. 2010, pp. 731-740.

* cited by examiner

SAR ADC

CROSS REFERENCE TO RELATED APPLICATION(S)

This application is a 35 U.S.C. § 371 National Phase Entry Application of PCT/EP2020/067812, filed Jun. 25, 2020, designating the United States, the disclosure of which is incorporated herein by reference in its entirety.

TECHNICAL FIELD

The present invention relates to a successive-approximation register analog-to-digital converter (SAR ADC) and circuits and apparatuses comprising such a SAR ADC.

BACKGROUND

Voltage reference buffer is a critical block in a successive-approximation register (SAR) analog-to-digital converter (ADC). A SAR ADC may comprise a capacitive digital-to-analog converter (CDAC) in a feedback loop. A low output impedance and high closed loop bandwidth of the reference buffer is highly desirable to aid in faster CDAC voltage settling. This comes at a cost of increased power consumption and chip area. The output of the voltage reference buffer is often connected to a large decoupling capacitor, which supply the large transients required during a high speed CDAC switching operation.

The large decoupling capacitor occupies a large chip area, which can be costly in advanced manufacturing technology nodes, such as a sub-20 nm complementary metal-oxide-semiconductor (CMOS) process. The large decoupling capacitor can also help to attenuate the ripple seen at the output of the reference buffer due to ADC operation such as CDAC switching. When working with time interleaved (TI) ADCs, comprising a number of sub-ADCs sharing a common reference buffer, it is important to reduce the extent of ripple seen at the output of the voltage reference buffer. Inability to reduce these ripples may degrade the dynamic and static performance of the TI-ADC. The ripples on the voltage reference buffer can result in incomplete CDAC settling, shifts in common-mode voltage seen by the comparator and/or changing the effective bit-cycle full scale (due to ripple on positive and negative reference voltages).

Depending on the source of the ripple, which can also be seen as noise, such as input analog signal leaking through an off-MOSFET (MOS field-effect transistor) switch, which could result in cross-talk between various sub-ADCs operation and result in an unwanted memory in the system. This unwanted memory or cross talk between sub-ADCs will result in degradation of the TI-ADC performance.

In U.S. Pat. No. 6,958,722 B1, reference voltage (VRef) switching load and DAC settling time are reduced by using two separately buffered copies of VRef to alternately converted sub-segments of the total number of bits. Segments of previously decided bits remain still and are approximated from one reference, while the few current conversions use the other. Since those bits are not so many, their load on the reference are also reduced. Similarly, signal-dependent loading of reference voltages is suppressed in U.S. Pat. No. 9,312,877 B2 by using two sets of nominally equal references-one for charging the capacitors prior to (and if decision is 0, right after) the decision, and the other to later maintaining the correct values. This minimizes switching transients and load on the second reference and thus on the held approximation value. A drawback of these approaches is that there is an additional overhead for a second reference voltage. Furthermore, both reference voltages have to be accurately matched (much less than ½LSB precision). Hence, these approaches help in terms of faster settling, but may lead to additional chip area requirements.

In C. Liu, S. Chang, G. Huang and Y. Lin, "A 10-bit 50-MS/s SAR ADC With a Monotonic Capacitor Switching Procedure," in IEEE Journal of Solid-State Circuits, vol. 45, no. 4, pp. 731-740, April 2010, top plate sampling in the CDAC is used. Since the top-plate of the charge redistribution based CDAC remains floating during the bit-cycle operation, any signal that couples to this node changes the comparator's input voltage and this can result in performance degradation. The high frequency input signal coupling due to drain-source capacitance of the MOSFET can be cancelled by having similar input signal sampling switch or capacitor that is equivalent to the drain-source capacitance cross-coupled between the differential CDAC's top-plate. It is suggested to use a dummy MOSFET based switch for higher cancellation precision. However, this cross-coupled cancellation device mechanism to cancel the input signal leakage does not affect the voltage reference buffer output node.

Another approach is to use redundancy and error-correction capabilities, such as in U.S. Pat. No. 9,496,888B1, which relaxes the CDAC voltage settling requirements. However, if the error sources such as the analog input signal leaking from an off-state MOSFET to the output of the reference buffer does not scale-down proportionally to the full-scale range in subsequent bit cycles, this can easily degrade the ADC performance.

SUMMARY

The inventor has developed circuitry that suppresses reference-voltage ripple in a SAR ADC. This may, for instance, be utilized to reduce the size requirements on decoupling capacitors.

According to a first aspect, there is provided a SAR ADC. It comprises a differential input port having a first input configured to receive a first input voltage and a second input configured to receive a second input voltage, of opposite polarity compared with first input voltage. It further comprises a reference-voltage port having a first reference-voltage input and a second reference-voltage input, wherein the first reference-voltage input is configured to receive a first reference voltage and the second reference-voltage input is configured to receive a second reference voltage. The second reference voltage is lower than the first reference voltage.

The SAR ADC comprises a CDAC having a differential topology with a first sub circuit and a second sub circuit. The first sub circuit comprises a first plurality of capacitors, each connected to a common node of the first sub circuit with a first terminal. The second sub circuit comprises a second plurality of capacitors, each connected to a common node of the second sub circuit with a first terminal.

For each capacitor of the first plurality of capacitors, the first sub circuit comprises a first switch connected between the first input of the SAR ADC and a second terminal of that capacitor, a second switch connected between the first reference-voltage input and the second terminal of that capacitor, a third switch connected between the second reference-voltage input and the second terminal of that capacitor, and a capacitive device connected between the second input of the SAR ADC and the second terminal of that capacitor.

For each capacitor of the second plurality of capacitors, the second sub circuit comprises a first switch connected between the second input of the SAR ADC and a second terminal of that capacitor, a second switch connected between the second reference-voltage input and the second terminal of that capacitor, a third switch connected between the first reference-voltage input and the second terminal of that capacitor, and a capacitive device connected between the first input of the SAR ADC and the second terminal of that capacitor.

In some embodiments, the reference-voltage port has a third reference voltage input for receiving a third reference voltage, For each capacitor of the first plurality of capacitors, the first sub circuit may comprise a fourth switch connected between the third reference-voltage input and the second terminal of that capacitor. Similarly, for each capacitor of the second plurality of capacitors, the second sub circuit may comprise a fourth switch connected between the third reference-voltage input and the second terminal of that capacitor.

The SAR ADC may comprise a first capacitor connected to the common node of the first sub circuit with a first terminal, a reference switch connected between a second terminal of the first capacitor and the third reference-voltage input, and an input switch connected between the second terminal of the first capacitor and the first input. Furthermore, the SAR ADC may comprise a second capacitor connected to the common node of the second sub circuit with a first terminal, a reference switch connected between a second terminal of the second capacitor and the third reference-voltage input, and an input switch connected between the second terminal of the second capacitor and the second input. Moreover, the SAR ADC may comprise a switch connected between the third reference voltage input and the common node of the first sub circuit and a switch connected between the third reference voltage input and the common node of the second sub circuit.

The SAR ADC may comprise a capacitive device connected between the second input and the second terminal of the first capacitor. Furthermore, the SAR ADC may comprise a capacitive device connected between the first input and the second terminal of the second capacitor.

According to some embodiments, at least one of the capacitive devices is implemented as a switch in its off state, wherein said switch is of the same type as the first switch or input switch connected to the same capacitor. According to some embodiments, each of the capacitive devices is implemented as switch in its off state, wherein said switch is of the same type as the first switch or input switch connected to the same capacitor.

According to some embodiments, at least one of the capacitive devices is implemented as a capacitor. According to some embodiments, each of the capacitive devices is implemented as a capacitor.

The SAR ADC may comprise a reference-voltage generator configured to generate the reference voltages.

According to a second aspect, there is provided a time-interleaved (TI) ADC comprising a plurality of SAR ADCs according to the first aspect as sub ADCs.

In some embodiments, the TI ADC comprises a reference-voltage generator configured to generate common reference voltages to the SAR ADCs.

According to a third aspect, there is provided an integrated circuit comprising the ADC of the first or second aspect.

According to a fourth aspect, there is provided a receiver circuit comprising the ADC of the first or second aspect.

According to a fifth aspect, there is provided an electronic apparatus comprising the ADC of the first or second aspect.

The electronic apparatus may e.g. be a communication apparatus, such as a wireless communication device for a cellular communications system or a base station for a cellular communications system.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

DETAILED DESCRIPTION

Figure 1:
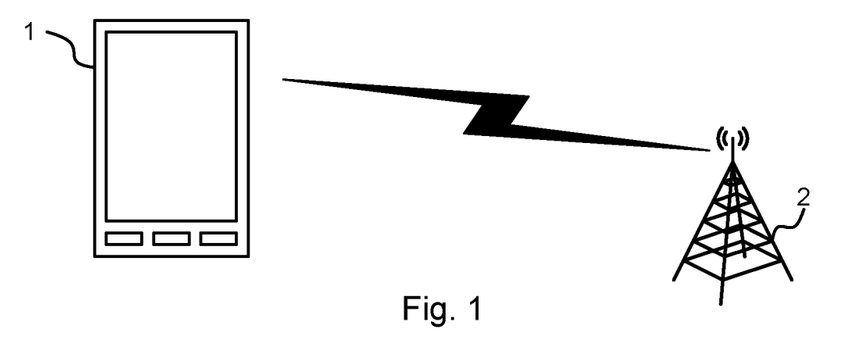
FIG. 1 illustrates a communication environment.

FIG. 1 illustrates a communication environment wherein embodiments of the present invention may be employed. A wireless communication device 1, or wireless device 1 for short, of a cellular communications system is in wireless communication with a radio base station 2 of the cellular communications system. The wireless device 1 may be what is generally referred to as a user equipment (UE). The wireless devices 1 is depicted in FIG. 1 as a mobile phone, but may be any kind of device with cellular communication capabilities, such as a tablet or laptop computer, machine-type communication (MTC) device, or similar.

Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device.

Figure 2:
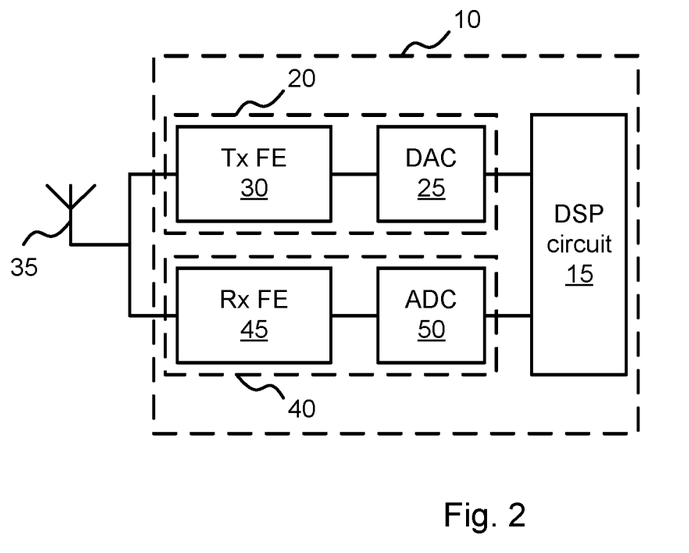
FIG. 2 illustrates a transceiver circuit.

FIG. 2 is a block diagram of an embodiment of a transceiver circuit 10, which can be comprised in a communication apparatus, such as the radio base station 2 or the wireless device 1. In the embodiment illustrated in FIG. 2, the transceiver circuit 10 comprises a digital signal processing (DSP) circuit 15. The DSP circuit 15 may e.g. be what is commonly referred to as baseband processor. The DSP circuit 15 may e.g. be configured to perform various digital signal processing tasks, such as one or more of coding, decoding, modulation, demodulation, fast Fourier transform (FFT), inverse FFT (IFFT), mapping, demapping, etc.

Furthermore, in the embodiment illustrated in FIG. 2, the transceiver circuit 10 comprises a transmitter circuit 20. The transmitter circuit 20 comprises a digital-to-analog converter (DAC) 25. The DAC 25 is connected to the DSP circuit 15 and configured to receive, as an input signal of the DAC 25, a digital representation of a signal to be transmitted from the DSP circuit 15. The DAC 25 is further configured to convert the signal to be transmitted to an analog representation, which is an output signal of the DAC 25. The transmitter circuit 20 also comprises a transmitter (Tx) frontend (FE) circuit 30 connected between the DAC 25 and an antenna 35. The Tx FE circuit 30 is configured to transform the output signal from the DAC 25 to a format suitable for transmission via the antenna 35. This may include operations such as frequency upconversion, filtering, and/or amplification. The Tx FE circuit 30 may comprise one or more mixers, filters, and/or amplifiers, such as power amplifiers (PAs), to perform such operations. The design of such Tx FE circuits is, per se, well known to a person skilled in the field of radio transceiver design, and is not discussed herein in any further detail.

Moreover, in the embodiment illustrated in FIG. 2, the transceiver circuit 10 comprises a receiver circuit 40. The receiver circuit 40 comprises a receiver (Rx) FE circuit 45 connected to the antenna 35. Furthermore, the receiver circuit 40 comprises an ADC 50. The ADC 50 is connected between the Rx FE circuit 45 and the DSP circuit 15. The Rx FE circuit is 45 is configured to transform a signal received via the antenna 35 to a format suitable to be input to the ADC 50. This may include operations such as frequency downconversion, filtering, and/or amplification. The Rx FE circuit 45 may comprise one or more mixers, filters, and/or amplifiers, such as low-noise amplifiers (LNAs), to perform such operations. The design of such Rx FE circuits is, per se, well known to a person skilled in the field of radio transceiver design, and is not discussed herein in any further detail. The ADC 50 is configured to receive its (analog) input signal from the Rx FE circuit, and convert it to a digital representation to generate the digital output signal of the ADC 50. This digital output signal of the ADC 50 is input to the DSP circuit 15 for further digital signal processing.

In some embodiments of the present disclosure, the ADC 50 is implemented as a SAR ADC. In some embodiments of the present disclosure, the ADC 50 is implemented as a TI-ADC comprising sub ADCs implemented as SAR ADCs.

Figure 3:
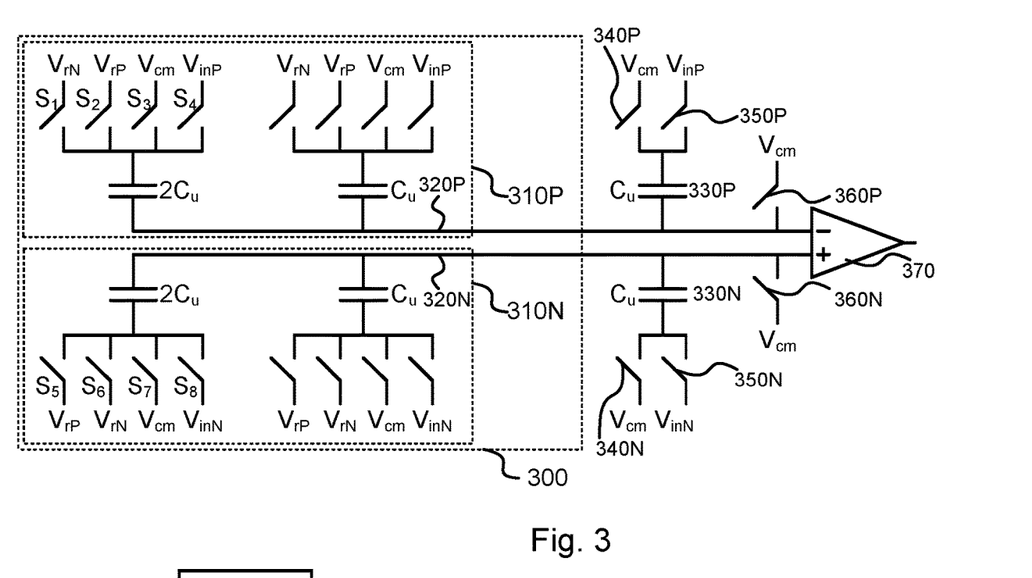
FIGS. 3-5 show schematic circuit diagrams.

FIG. 3 is a schematic circuit diagram of part of a SAR ADC used as a reference example in this disclosure for illustrating problems that are solved, or at least reduced, with embodiments disclosed herein.

According to this reference example, the SAR ADC comprises a differential input port having a first input, denoted $V_{inP}$ in FIG. 3, and a second input, denoted $V_{inN}$ in FIG. 3. The first input $V_{inP}$ is configured to receive a first input voltage. In the following, the first input voltage is also denoted $V_{inP}$. The second input $V_{inN}$ is configured to receive a second input voltage. In the following, the second input voltage is also denoted $V_{inN}$. The input voltages $V_{inP}$ and $V_{inN}$ have opposite polarities and together form a differential input signal. Opposite polarities, in this context, means that the input voltage $V_{inP}$ is considered as a positive signal component and the input voltage $V_{inN}$ is seen as a negative signal component, and that the value of the differential signal is the difference between $V_{inP}$ and $V_{inN}$.

Furthermore, in the reference example, the SAR-ADC comprises a reference-voltage port having a first reference-voltage input $V_{rP}$ and a second reference-voltage input $V_{rN}$. The first reference-voltage input $V_{rP}$ is configured to receive a first reference voltage, also denoted $V_{rP}$ in the following. The second reference-voltage input $V_{rN}$ is configured to receive a second reference voltage, also denoted $V_{rN}$ in the following. The second reference voltage $V_{rN}$ is lower than the first reference voltage $V_{rP}$.

According to the reference example, the SAR ADC also comprises a capacitive DAC (CDAC) 300 having a differential topology with a first sub circuit 310P and a second sub circuit 310N. The first sub circuit 310P comprises a first plurality of capacitors. In FIG. 3, the CDAC is a two-bit CDAC and the number of capacitors in the first plurality is therefore also two, and these are labeled $2C_u$ and $C_u$ indicating their capacitances, where $C_u$ is a unit capacitance. More generally, an N-bit binary-weighted CDAC would have N binary weighted capacitors (i.e. where the capacitances are $2^0 C_u$, $2^1 C_u$, $2^2 C_u$, . . . , $2^{N-1} C_u$) in the first plurality. Other types of CDACs than binary-weighted may be used in some embodiments. Each of the capacitors in the first plurality is connected to a common node 320P of the first sub circuit 310P with a first terminal. In FIG. 3, the common node 320P is connected to a negative input of a comparator 370. The second sub circuit 310N comprises a second plurality of capacitors. As above, the CDAC in FIG. 3 is a two-bit CDAC and, the second plurality also comprises two capacitors labeled $2C_u$, $C_u$ indicating their capacitances. As for the first plurality, an N-bit binary-weighted CDAC would have N binary-weighted capacitors in the second plurality. Again, other types of CDACs than binary-weighted may be used in some embodiments. Each of the capacitors in the first plurality is connected to a common node 320N of the second sub circuit 310N with a first terminal. In FIG. 3, the common node 320N is connected to a positive input of the comparator 370. In some embodiments, the common nodes 320P and 320N may instead be connected to the positive input and the negative input, respectively, of the comparator 370. This would result in an inverted output of the comparator 370 compared with the connections shown in FIG. 3.

For each capacitor of the first plurality of capacitors, the first sub circuit 310P comprises a first switch connected between the first input $V_{inP}$ of the SAR ADC and a second terminal of that capacitor. This switch is labeled $S_4$ in FIG. 3 for the $2C_u$ capacitor. Furthermore, for each capacitor of the first plurality of capacitors, the first sub circuit 310P comprises a second switch connected between the first reference-voltage input $V_{rP}$ and the second terminal of that capacitor. This switch is labeled $S_2$ in FIG. 3 for the $2C_u$ capacitor. Moreover, for each capacitor of the first plurality of capacitors, the first sub circuit 310P comprises a third switch connected between the second reference-voltage input $V_{rN}$ and the second terminal of that capacitor. This switch is labeled $S_2$ in FIG. 3 for the $2C_u$ capacitor.

For each capacitor of the second plurality of capacitors, the second sub circuit 310N comprises a first switch connected between the second input $V_{inN}$ of the SAR ADC and a second terminal of that capacitor. This switch is labeled $S_8$ in FIG. 3 for the $2C_u$ capacitor. Furthermore, for each capacitor of the second plurality of capacitors, the second sub circuit 310N comprises a second switch connected between the second reference-voltage input $V_{rN}$ and the second terminal of that capacitor. This switch is labeled $S_6$ in FIG. 3 for the $2C_u$ capacitor. Moreover, for each capacitor of the second plurality of capacitors, the second sub circuit 310N comprises a third switch connected between the first reference-voltage input $V_{rP}$ and the second terminal of that capacitor. This switch is labeled $S_2$ in FIG. 3 for the $2C_u$ capacitor.

It should be noted that the particular type of SAR ADC shown in the reference example in FIG. 3 comprises some additional components and an additional reference-voltage input, that are further described below. However, there are other types of SAR ADCs that do not have these additional features, but still are susceptible the same kind of problems described below and also benefit from the proposed counteraction of these problems. For instance, in the particular type of SAR ADC shown in the reference example in FIG. 3, the reference-voltage port has a third reference voltage input $V_{cm}$ for receiving a third reference voltage, or common-mode reference voltage, also denoted $V_{cm}$ in the following. Furthermore, for each capacitor of the first plurality of capacitors, the first sub circuit 310P comprises a fourth switch connected between the third reference-voltage input $V_{cm}$ and the second terminal of that capacitor. This switch is labeled $S_3$ in FIG. 3 for the $2C_u$ capacitor. Moreover, for each capacitor of the second plurality of capacitors, the second sub circuit 310N comprises a fourth switch connected between the third reference-voltage input $V_{cm}$ and the second terminal of that capacitor. This switch is labeled $S_7$ in FIG. 3 for the $2C_u$ capacitor. The particular type of SAR ADC shown in the reference example in FIG. 3 also comprises additional capacitors 330P and 330N, both with capacitance $C_u$. The capacitor 330P is connected to the common node 320P with a first terminal. A switch 340P, referred to below as "reference switch 340P", is connected between a second terminal of the capacitor 330P and the third reference-voltage input $V_{cm}$. A switch 350P, referred to below as "input switch 350P", is connected between the second terminal of the capacitor 330P and the first input $V_{inP}$. The capacitor 330N is connected to the common node 320N with a first terminal. A switch 340N, referred to below as "reference switch 340N", is connected between a second terminal of the capacitor 330N and the third reference-voltage input $V_{cm}$. A switch 350N, referred to below as "input switch 350N", is connected between the second terminal of the capacitor 330N and the second input $V_{inN}$. Furthermore, the particular type of SAR ADC shown in the reference example in FIG. 3 comprises switches 360P and 360N connected between the third reference voltage input $V_{cm}$ and the common nodes 320P and 320N, respectively. The terms "input" and "reference" in "input switch" and "reference switch" are used herein as mere labels to distinguish these switches and do not imply any particular physical properties of these switches.

Operation of the SAR ADC in the reference example in FIG. 3 is well known and therefore only briefly described. The SAR ADC operates in different phases, a sampling phase and a conversion phase. During the sampling phase, the above-mentioned first switches (e.g. $S_4$ and $S_8$) connected to the capacitors in the CDAC are closed. Furthermore, input switches 350P and 350N and switches 360P and 360N are also closed. The other switches are open. In a transition between the sampling phase and the conversion phase, said first switches (e.g. $S_4$ and $S_8$) connected to the capacitors in the CDAC, the input switches 350P and 350N, and the switches 360P and 360N are opened. Thereby, the first input voltage $V_{inP}$ is sampled at the capacitors in the first sub circuit 310P and the capacitor 330P. Similarly, the second input voltage $V_{inN}$ is sampled at the capacitors in the second sub circuit 310N and the capacitor 330N. Subsequently, the above-mentioned fourth switches (e.g. $S_3$ and $S_7$) connected to the capacitors in the CDAC are closed. Furthermore, the reference switches 340P and 340N are also closed. This effectively means that the comparator 370 compares the sampled differential input voltage with a threshold of 0 V. The output of the comparator 370 is then used as the most significant bit (MSB) of the output of the ADC. The fourth switches $S_3$ and $S_7$ connected to the $2C_u$ capacitors in the CDAC 300 are then opened. If the MSB is '1', the second switches $S_2$ and $S_6$ connected to the $2C_u$ capacitors in the CDAC 300 are closed for the remainder of the conversion phase. If the MSB is '0', the third switches $S_1$ and $S_5$ connected to the $2C_u$ capacitors in the CDAC 300 are closed for the remainder of the conversion phase. This process is repeated for each bit in order of decreasing significance (corresponding to order of decreasing capacitance for the capacitors in the CDAC) until each bit of the ADC output has been determined.

Other types of SAR ADCs, such as SAR ADCs with only two reference voltages $V_{rP}$ and $V_{rN}$, can have a slightly different operation of switches in the CDAC. However, such different types of SAR ADCs and their respective operations are well known to persons skilled in the art of ADC design and is not further described herein.

Figure 4:
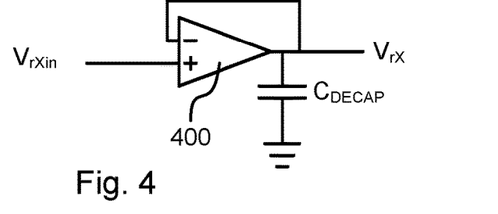

FIG. 4 illustrates a circuit that may be used to generate reference voltages, such as $V_{rP}$ and $V_{rN}$. It comprises a differential amplifier 400 (also referred to as voltage reference buffer below) connected in a feedback configuration with its output connected to its negative input. A decoupling capacitor $C_{DECAP}$ is connected to the output of the differential amplifier. A reference voltage $V_{rX}$, where X may be either P or N, is generated at the output of the differential amplifier. A corresponding voltage $V_{rXin}$ is applied at the positive input of the differential amplifier 400. The voltage $V_{rXin}$ may e.g. be generated by a resistive voltage divider or similar circuit. The reference voltage $V_{cm}$ may be generated in the same way.

Referring again to FIG. 3, consider a part of the conversion phase where one of the switches $S_1$ and $S_2$ is closed and the switch $S_4$ is open. Ideally, $V_{inP}$ is isolated from $V_{rP}$ and $V_{rN}$. However, for instance if the switches are implemented with MOSFETs (Metal Oxide Semiconductor Field-Effect Transistors) or similar types of field-effect transistors, the switch $S_4$ in the off-state provides a predominantly capacitive path, e.g. due to the drain-to-source capacitance in case of a MOSFET switch, from $V_{inP}$ to the second terminal of the $2C_u$ capacitor of the first sub circuit 320P. There is also some contribution to this path from the finite off-resistance of the switches. Thus, there exists a leakage path from $V_{inP}$ to $V_{rN}$ or $V_{rP}$ through the open switch $S_4$ and the closed switch $S_1$ or $S_2$. Thereby, changes in $V_{inP}$ will also affect the reference voltage $V_{rN}$ or $V_{rP}$ through the closed switch $S_1$ or $S_2$ and cause an unwanted ripple on that reference voltage $V_{rN}$ or $V_{rP}$, which in turn degrades the performance of the SAR ADC. Although the discussion above is given with reference to $V_{inP}$ and the switches coupled to the $2C_u$ capacitor of the first sub circuit 310P, similar leakage paths exist also for the switches coupled to the other capacitors of the CDAC 300, and from $V_{inN}$ as well.

As mentioned above, this type of leakage problem exists for other types of SAR ADCs as well, such as those having only two reference voltage $V_{rP}$ and $V_{rN}$. For the particular type of SAR ADC shown in FIG. 3, there is a similar leakage from the inputs $V_{inN}$ and $V_{inP}$ to $V_{cm}$ as well. The decoupling capacitor $C_{DECAP}$ will partly help suppress the ripple. However, it cannot completely remove the ripple, and a sufficient suppression of the ripple might require an excessively large decoupling capacitor $C_{DECAP}$.

Unfortunately, having a differential CDAC where the differential input signals couple to the output of the voltage reference buffer does not result in cancellation of the leakage signals. Furthermore, mismatch in transistors will result in a different off-resistance and drain-to-source coupling capacitance, which may worsen the magnitude of the ripple seen at the output of the voltage reference buffer.

According to embodiments of the present disclosure, for each capacitor of the first plurality of capacitors, the first sub circuit 310P comprises a capacitive device connected between the second input $V_{inN}$ of the SAR ADC and the second terminal of that capacitor. Similarly, for each capacitor of the second plurality of capacitors, the second sub circuit comprises a capacitive device $X_N$ connected between the first input $V_{inP}$ of the SAR ADC and the second terminal of that capacitor.

Figure 5:
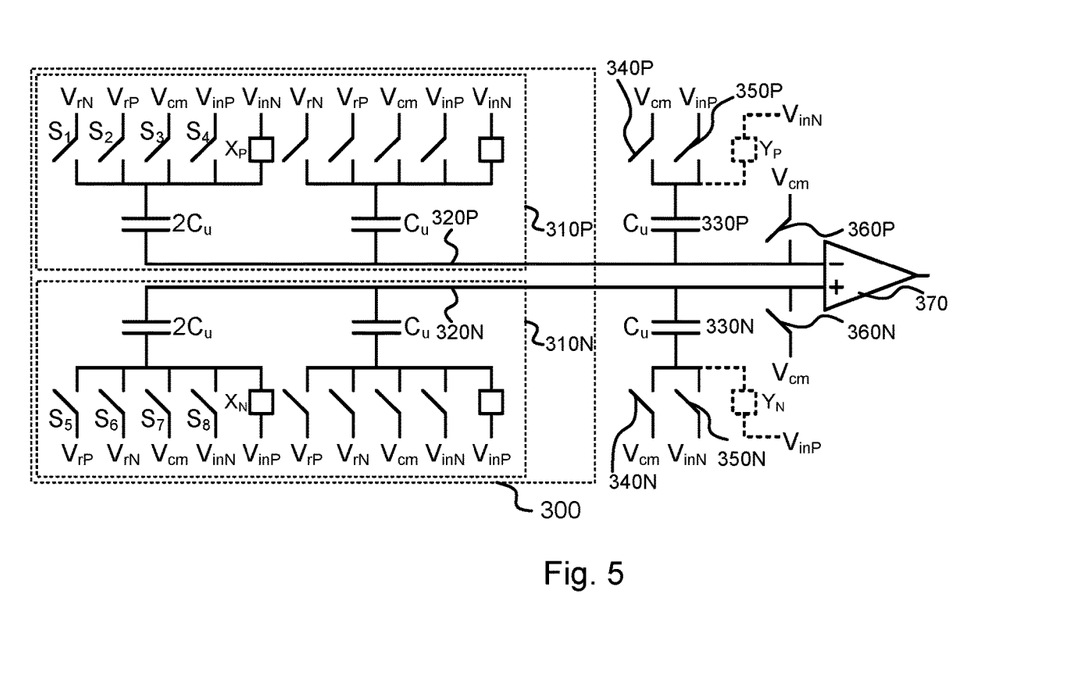

An example of such an embodiment is illustrated in FIG. 5. Elements corresponding to those in FIG. 3 are not further described. Said devices are illustrated with squares. For the $2C_u$ capacitor in the first sub circuit 310P, said capacitive device is labeled $X_P$. For the $2C_u$ capacitor in the second sub circuit 310N, said capacitive device is labeled $X_N$.

A change in $V_{inP}$ is accompanied with a corresponding change in the opposite direction on $V_{inN}$, and vice versa. The capacitive device $X_P$ thus provides a leakage path from $V_{inN}$ that, fully or partly, cancels the leakage from $V_{inP}$ through $S_4$ and thereby helps reducing or removing the ripple on the reference voltages caused by said leakage. Similarly, the capacitive device $X_N$ thus provides a leakage path from $V_{inP}$ that, fully or partly, cancels the leakage from $V_{inN}$ through $S_8$ and thereby helps reducing or removing the ripple on the reference voltages caused by said leakage. Similar reasoning applies to the other capacitive devices.

As illustrated in FIG. 5, for the particular type of SAR ADC illustrated in FIG. 3, similar capacitive devices $Y_P$ and $Y_N$ can be connected between $V_{inN}$ and the second terminal of the capacitor 330P and between $V_{inP}$ and the second terminal of the capacitor 330N, respectively, to fully or partially cancel leakage through the input switches 350P and 350N, respectively.

According to some embodiments, at least one of the capacitive devices in the CDAC 300 (e.g. $X_P$ and/or $X_N$) is implemented as a switch in its off state, wherein said switch is of the same type as the first switch (e.g. $S_4$ and/or $S_8$) connected to the same capacitor. For instance, if said first switch is implemented with an NMOS transistor, the corresponding capacitive device is implemented with an off-state NMOS transistor of the same dimension. If said first switch is implemented with a PMOS transistor, the corresponding capacitive device is implemented with an off-state PMOS transistor of the same dimension. If said first switch is implemented with a transmission gate, the corresponding capacitive device is implemented with an off-state transmission gate of the same dimension. Said switch in its off state may e.g. be hardwired in the off state. In some embodiments, each of the capacitive devices in the CDAC 300 is implemented in this way.

Each of the capacitive devices $Y_P$ and $Y_N$ can similarly be implemented as a switch in its off state, wherein the switch is of the same type as the input switch 350P and the input switch 350N, respectively. Again, said switch in its off state may e.g. be hardwired in the off state.

According to some embodiments, at least one of the capacitive devices in the CDAC 300 (e.g. $X_P$ and/or $X_N$) is implemented as a capacitor. In some each of the capacitive devices in the CDAC 300 is implemented as a capacitor. The capacitive devices $Y_P$ and $Y_N$ may also be implemented as capacitors. The sizes of the capacitors can be selected by means of simulations such that a given performance specification is met. A person skilled in the art of ADC design would be capable of performing such simulations.

The term "capacitive device" should not be interpreted strictly as a device that is purely capacitive, since such an ideal device cannot be manufactured in practice. For instance, as mentioned above, switches implemented with MOSFET transistors suffer from finite off-resistance. Hence, a capacitive device $X_P$, $X_N$, $Y_P$, or $Y_N$ implemented as a switch in its off state will also have resistive component to its characteristic. Furthermore, capacitive devices implemented as capacitors, e.g. using metal layers and insulating oxide layers of a semiconductor manufacturing process, will not be purely capacitive either.

The table below shows system level simulation results of a 10-bit SAR ADC to verify the extent of performance enhancement by using capacitive devices implemented with capacitors. The circuit simulations were carried out in a 7-nm CMOS FinFET technology, using a sampling frequency of 300 Msamples/s, a temperature of 85° C., and a supply voltage of 0.75 V. The typical-typical process corner (typical NMOS transistors, typical PMOS transistors) is used in the simulations. Sinusoidal test signals with three different frequencies are used, 13.48 MHz, 74.41 MHz, and 141.2 MHz. The signal-to-noise-and-distrion ratio (SNDR) and the spurious-free dynamic range (SFDR) are used as metrics. Row A shows the results without capacitive devices (i.e. for the type of ADC shown in FIG. 3) and row B shows the results with capacitive devices. A 13.21 dB improvement in SNDR and 12.88 dB improvement in SFDR at Nyquist sampling (i.e. the 141.2 MHz test signal) is observed when comparing the system without capacitive devices (row A) and with the proposed capacitive devices (row B).

| | Typical-Typical Corner | | | | | |
|---|---|---|---|---|---|---|
| | 13.48 MHz | | 74.41 MHz | | 141.2 MHz | |
| | SNDR [dB] | SFDR [dB] | SNDR [dB] | SFDR [dB] | SNDR [dB] | SFDR [dB] |
| A | 30.50 | 36.32 | 30.47 | 36.23 | 30.44 | 36.31 |
| B | 47.91 | 59.38 | 46.59 | 52.26 | 43.65 | 49.19 |

According to some embodiments, the SAR ADC may comprise a reference-voltage generator configured to generate the first reference voltage $V_{rP}$ and the second reference voltage $V_{rN}$, for instance comprising circuitry such as that illustrated in FIG. 4. In some embodiments, said reference-voltage generator is configured to generate $V_{cm}$ as well. Hence, the reference-voltage port may be an internal port of the SAR ADC. In other embodiments, said reference-voltage generator may be a component external to the SAR ADC.

According to some embodiments, there is provided a TI ADC comprising a plurality of SAR ADCs according to embodiments described above as sub ADCs.

Figure 6:
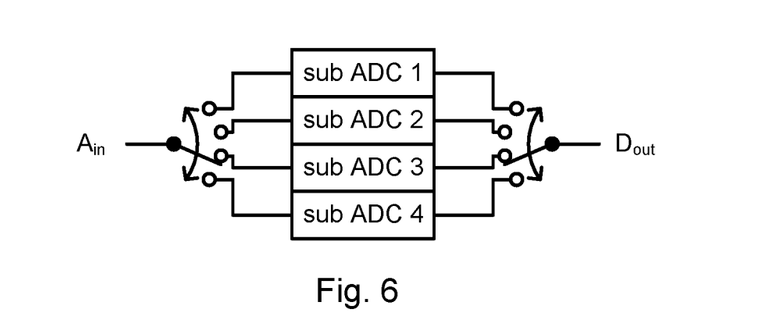
FIG. 6 schematically illustrates a TI ADC.

A TI ADC is illustrated schematically in FIG. 6. The particular example in FIG. 6 is a 4-channel TI ADC, i.e. having 4 sub ADCs labeled sub ADC 1-4. Each of these sub ADCs operates on every fourth (or, for a general M-channel TI ADC, on every $M^{th}$) sample of the analog input $A_{in}$ to generate every fourth (or $M^{th}$) sample of the digital output Dout. The general principles of TI ADCs are well known and not further described herein. It should be noted that in the case of a TI ADC, the SAR ADCs may share a common reference voltage generator comprised in the TI ADC that is configured to generate a common first reference voltage $V_{rP}$ and a common second reference voltage $V_{rN}$ to the SAR ADCs. Said common reference voltage generator may also be configured to generate a common $V_{cm}$ to the SAR ADCs.

Figure 7:
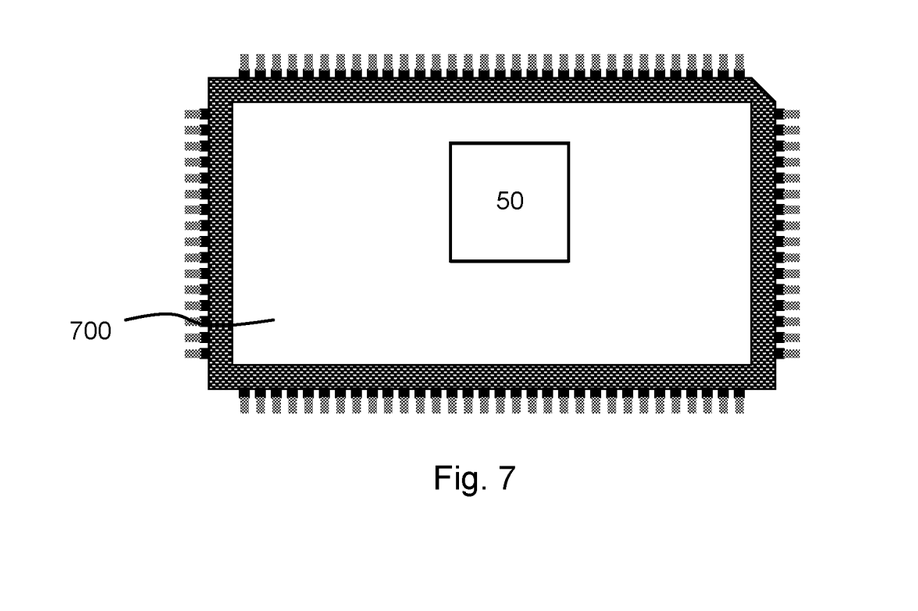
FIG. 7 illustrates an integrated circuit.

The ADC embodiments described herein are suitable for integration on an integrated circuit. This is illustrated in FIG. 7, schematically showing an integrated circuit 700 comprising the ADC 50.

The disclosure above refers to specific embodiments. However, other embodiments than the above described are possible within the scope of the disclosure. For example, the ADC 50 may be used in other types of electronic apparatuses than communication apparatuses where conversion from the analog to the digital domain is needed. The different features and steps of the embodiments may be combined in other combinations than those described.

The invention claimed is:

1. A successive-approximation register, SAR, analog-to-digital converter, ADC, comprising:
  a differential input port having a first input configured to receive a first input voltage and a second input configured to receive a second input voltage, of opposite polarity compared with first input voltage;
  a reference-voltage port having a first reference-voltage input and a second reference-voltage input, wherein the first reference-voltage input is configured to receive a first reference voltage and the second reference-voltage input is configured to receive a second reference voltage, lower than the first reference voltage;
  a capacitive digital-to-analog converter, CDAC, having a differential topology with a first sub circuit comprising a first plurality of capacitors, each connected to a common node of the first sub circuit with a first terminal, and a second sub circuit comprising a second plurality of capacitors, each connected to a common node of the second sub circuit with a first terminal, wherein
  for each capacitor of the first plurality of capacitors, the first sub circuit comprises:
  a first switch connected between the first input of the SAR ADC and a second terminal of that capacitor;
  a second switch connected between the first reference-voltage input and the second terminal of that capacitor;
  a third switch connected between the second reference-voltage input and the second terminal of that capacitor; and
  a capacitive device connected between the second input of the SAR ADC and the second terminal of that capacitor; and
  for each capacitor of the second plurality of capacitors, the second sub circuit comprises:
  a first switch connected between the second input of the SAR ADC and a second terminal of that capacitor;
  a second switch connected between the second reference-voltage input and the second terminal of that capacitor;
  a third switch connected between the first reference-voltage input and the second terminal of that capacitor; and
  a capacitive device connected between the first input of the SAR ADC and the second terminal of that capacitor.

2. The SAR ADC of claim 1, wherein
  the reference-voltage port has a third reference voltage input for receiving a third reference voltage;
  for each capacitor of the first plurality of capacitors, the first sub circuit comprises a fourth switch connected between the third reference-voltage input and the second terminal of that capacitor; and
  for each capacitor of the second plurality of capacitors, the second sub circuit comprises a fourth switch connected between the third reference-voltage input and the second terminal of that capacitor.

3. The SAR ADC of claim 2, comprising
  a first capacitor connected to the common node of the first sub circuit with a first terminal;
  a reference switch connected between a second terminal of the first capacitor and the third reference-voltage input;
  an input switch connected between the second terminal of the first capacitor and the first input;
  a second capacitor connected to the common node of the second sub circuit with a first terminal;
  a reference switch connected between a second terminal of the second capacitor and the third reference-voltage input;
  a input switch connected between the second terminal of the second capacitor and the second input;
  a switch connected between the third reference voltage input and the common node of the first sub circuit; and
  a switch connected between the third reference voltage input and the common node of the second sub circuit.

4. The SAR ADC of claim 3, comprising:
  a capacitive device connected between the second input and the second terminal of the first capacitor; and
  a capacitive device connected between the first input and the second terminal of the second capacitor.

5. The SAR ADC of claim 1, wherein at least one of the capacitive devices is implemented as a switch in its off state, wherein said switch is of the same type as the first switch connected to the same capacitor.

6. The SAR ADC of claim 5, wherein each of the capacitive devices is implemented as switch in its off state, wherein said switch is of the same type as the first switch or input switch connected to the same capacitor.

7. The SAR ADC of claim 1, wherein at least one of the capacitive devices is implemented as a capacitor.

8. The SAR ADC of claim 7, wherein each of the capacitive devices is implemented as a capacitor.

9. The SAR ADC of claim 1, comprising a reference-voltage generator configured to generate the reference voltages.

10. A time-interleaved, TI, ADC comprising a plurality of SAR ADCs according to claim 1 as sub ADCs.

11. The TI ADC of claim 10, comprising a reference-voltage generator configured to generate common reference voltages to the SAR ADCs.

12. An integrated circuit comprising the ADC of any one of claim 1.

13. A receiver circuit comprising the ADC of any one of claim 1.

14. An electronic apparatus comprising the ADC of any one of claim 1.

15. The electronic apparatus of claim 14, wherein the electronic apparatus is a communication apparatus.

16. The electronic apparatus of claim 15, wherein the communication apparatus is a wireless communication device for a cellular communications system.

17. The electronic apparatus of claim 15, wherein the communication apparatus is a base station for a cellular communications system.

* * * * *